(12) United States Patent
Suzuki et al.

(10) Patent No.: US 8,243,524 B2
(45) Date of Patent: Aug. 14, 2012

(54) SEMICONDUCTOR STORAGE DEVICE

(75) Inventors: Yuya Suzuki, Yokohama (JP); Toshiki Hisada, Yokohama (JP); Yoshikazu Hosomura, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 308 days.

(21) Appl. No.: 12/723,864

(22) Filed: Mar. 15, 2010

(65) Prior Publication Data

US 2010/0232225 A1 Sep. 16, 2010

(30) Foreign Application Priority Data

Mar. 16, 2009 (JP) ................................ 2009-062577

(51) Int. Cl.
G11C 16/06 (2006.01)
(52) U.S. Cl. ................... 365/185.21; 365/196; 365/207; 365/230.06; 365/185.2
(58) Field of Classification Search ............. 365/185.21, 365/196, 207, 230.06, 185.2
See application file for complete search history.

(56) References Cited

U.S. PATENT DOCUMENTS

| | | | |
|---|---|---|---|
| 6,964,032 B2 | 11/2005 | Liebmann et al. | |
| 7,517,621 B2 | 4/2009 | Fukuhara et al. | |
| 2003/0107055 A1* | 6/2003 | Watanabe et al. | ............. 257/208 |
| 2009/0142706 A1 | 6/2009 | Masukawa et al. | |

FOREIGN PATENT DOCUMENTS

| | | |
|---|---|---|
| JP | 2004-266269 | 9/2004 |
| JP | 2004-348118 | 12/2004 |
| JP | 2008-27978 | 2/2008 |
| JP | 2008-66586 | 3/2008 |

* cited by examiner

*Primary Examiner* — Thong Q Le
(74) *Attorney, Agent, or Firm* — Oblon, Spivak, McClelland, Maier & Neustadt, L.L.P.

(57) ABSTRACT

A semiconductor storage device has a sense amplifier. The sense amplifier includes a first lower interconnection; a second interlayer insulation film formed on the first interlayer insulation film and top of the first interconnection; a contact interconnection formed in a direction perpendicular to a substrate plane of the semiconductor substrate so as to pass through the second interlayer insulation film, and connected to the first lower interconnection; a first upper interconnection formed on the second interlayer insulation film and connected to the contact interconnection disposed under the first upper interconnection; a dummy contact interconnection formed in a direction perpendicular to the substrate plane of the semiconductor substrate in the second interlayer insulation film, and adjacent to the contact interconnection; and a second upper interconnection formed on the second interlayer insulation film so as to extend in the first direction, and connected to the dummy contact interconnection disposed under the second upper interconnection.

20 Claims, 10 Drawing Sheets

SEMICONDUCTOR STORAGE DEVICE

CROSS-REFERENCE TO RELATED APPLICATION

This application is based upon and claims the benefit of priority from the prior Japanese Patent Application No. 2009-62577, filed on Mar. 16, 2009, the entire contents of which are incorporated herein by reference.

BACKGROUND OF THE INVENTION

1. Field of the Invention

The present invention relates to a semiconductor storage device including a plurality of interconnection layers which are connected by contact hole interconnections.

2. Background Art

In recent years, demands for small-sized large-capacity non-volatile semiconductor storage devices have increased rapidly. Among them, NAND flash memories which can be anticipated to have higher integration and larger capacities as compared with conventional NOR flash memories are attracting attention. The width and spacing (line and space) of interconnections in non-volatile semiconductor storage devices such as NAND flash memories are shrunk as the fine resolution technique advances.

In general, in non-volatile semiconductor memories, it is necessary to form contacts which electrically connect upper layer interconnections to the lower layer interconnections in areas where word lines and bit lines of memory cells make contact with a memory cell array and are pulled out to a peripheral circuit part. In general, it is more difficult to form contact holes by using photolithography than to form interconnections (see, for example, Japanese Patent Laid-Open No. 2004-348118).

Furthermore, in the conventional art, the memory cell array shrunk in size and the peripheral circuit having comparatively large patterns are subjected to exposure lighting together and processed.

As the size shrinking of the non-volatile semiconductor memory is advanced, the lithography margin and processing margin cannot be ensured, and consequently it is not possible to conduct exposure and processing on the memory cell array and the peripheral circuit collectively. Therefore, the double exposure technique and the double processing technique which use two photomasks on the same layer are used.

In addition, for period ends of the line and space, contacts of the bit lines and contacts of the source lines, a more complicated pattern arrangement or the Sub-Resolution Assist Feature (Sraf) arrangement functioning as a dummy pattern of reticles becomes necessary (see, for example, Japanese Patent Laid-Open No. 2008-66586). They exert a direct influence upon the increase of cost.

Furthermore, for example, the side wall processing technique is adopted to form the memory cell array. Therefore, the minimum exposure pitch of the element area, the word lines and the bit lines becomes twice the minimum processing pitch (see, for example, Japanese Patent Laid-Open No. 2008-27978). Therefore, the minimum size at the time of exposure becomes equal to, for example, the size of contact holes connected to the bit lines.

Especially if the side wall processing technique is adopted for interconnections of sense amplifiers which are denser in layout pattern than the peripheral circuit, pattern variations of contact holes connected to the interconnections increase. In this case, the difficulty of the exposure rises.

Furthermore, in the conventional art, the contact holes connected to the interconnections of the sense amplifiers have, for example, a pattern in which two contact holes are arranged in the bit line direction, and several Sraf's are associated in the word line direction. In the bit line direction as well, Sraf's are associated with between contact holes and above and below the contact holes.

Because of size shrinking and introduction of the side wall processing technique, however, the lithography margin is liable to become narrow for the contact holes connected to the interconnections of the sense amplifiers.

SUMMARY OF THE INVENTION

According to one aspect of the present invention, there is provided: a semiconductor storage device comprising:

a memory cell array including memory cell transistor from which data depending upon a value of a retained threshold voltage can be read out by applying a readout voltage to a control gate thereof;

a row decoder which controls voltage on a word line connected to the control gate of the memory cell transistor; and a sense amplifier connected to a bit line which is connected to the memory cell transistor, wherein the sense amplifier includes:

a first lower interconnection formed so as to extend in a first direction on a first interlayer insulation film formed on a semiconductor substrate;

a second interlayer insulation film formed on the first interlayer insulation film and top of the first interconnection;

a contact interconnection formed in a direction perpendicular to a substrate plane of the semiconductor substrate so as to pass through the second interlayer insulation film, and connected to the first lower interconnection;

a first upper interconnection formed on the second interlayer insulation film and connected to the contact interconnection disposed under the first upper interconnection;

a dummy contact interconnection formed in a direction perpendicular to the substrate plane of the semiconductor substrate in the second interlayer insulation film, and adjacent to the contact interconnection; and a second upper interconnection formed on the second interlayer insulation film so as to extend in the first direction, and connected to the dummy contact interconnection disposed under the second upper interconnection, and wherein a dummy lower interconnection is electrically connected only to the second upper interconnection.

According to another aspect of the present invention, there is provided: a semiconductor storage device comprising:

a memory cell array including memory cell transistor from which data depending upon a value of a retained threshold voltage can be read out by applying a readout voltage to a control gate thereof;

a row decoder which controls voltage on a word line connected to the control gate of the memory cell transistor; and a sense amplifier connected to a bit line which is connected to the memory cell transistor, wherein the sense amplifier includes:

a first lower interconnection formed so as to extend in a first direction on a first interlayer insulation film formed on a semiconductor substrate;

a second interlayer insulation film formed on the first interlayer insulation film and top of the first interconnection;

a contact interconnection formed in a direction perpendicular to a substrate plane of the semiconductor substrate so as to pass through the second interlayer insulation film, and connected to the first lower interconnection;

a first upper interconnection formed on the second interlayer insulation film and connected to the contact interconnection disposed under the first upper interconnection;

a dummy lower interconnection formed so as to extend in the first direction on the first interlayer insulation film;

a dummy contact interconnection formed in a direction perpendicular to the substrate plane of the semiconductor substrate so as to pass through the second interlayer insulation film, adjacent to the contact interconnection, and connected to the dummy lower interconnection; and a second upper interconnection formed on the second interlayer insulation film so as to extend in the first direction, and connected to the dummy contact interconnection disposed under the second upper interconnection, and wherein the dummy lower interconnection is electrically connected only to the second upper interconnection via the dummy contact interconnection.

DETAILED DESCRIPTION

Hereafter, a semiconductor storage device according to the present invention will be described more specifically with reference to the drawings. The ensuing embodiments will be described as to an example in which the semiconductor storage device is, for example, a NAND flash memory which is a non-volatile semiconductor storage device. The semiconductor storage device according to the present invention can be applied to other non-volatile semiconductor storage devices as well.

(First Embodiment)

Figure 1:
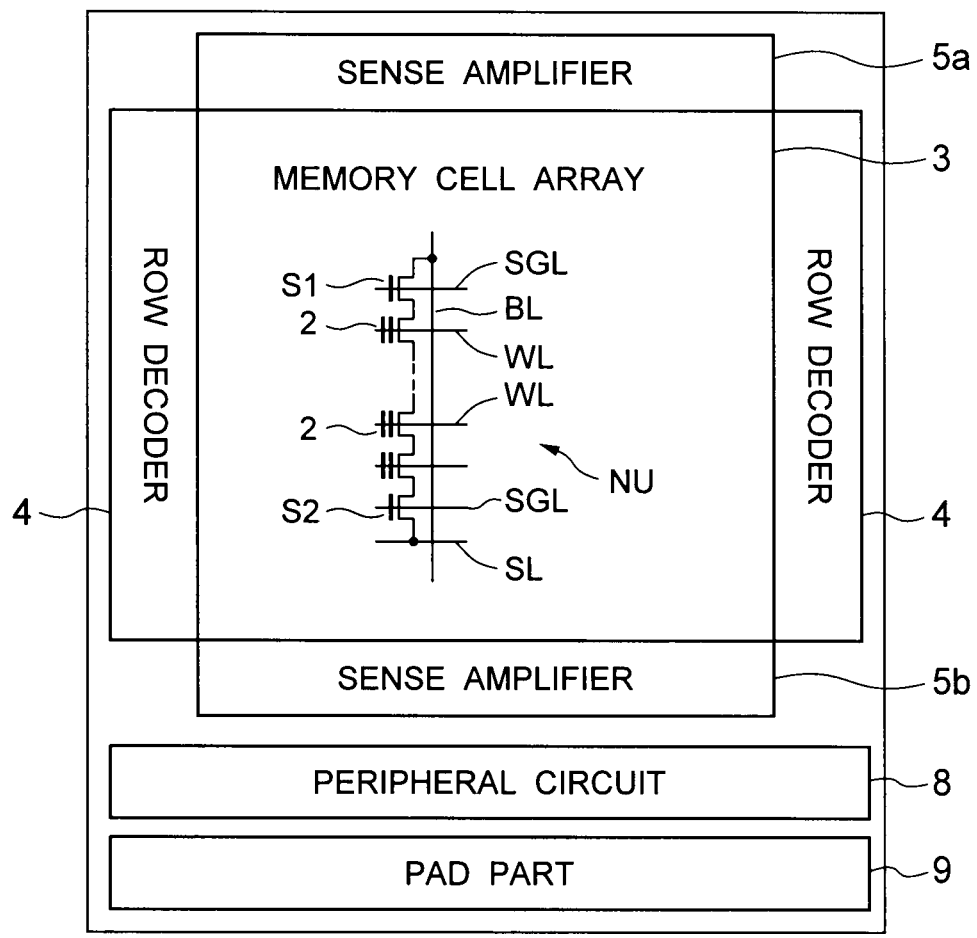
FIG. 1 is a block diagram showing an example of a NAND flash memory 100 including sense amplifiers according to a first embodiment which is a mode of the present invention.

FIG. 1 is a block diagram showing an example of a NAND flash memory 100 including sense amplifiers according to a first embodiment which is a mode of the present invention.

As shown in FIG. 1, the NAND flash memory 100 according to the present embodiment includes a memory cell array 3 having memory cell transistors 2 arranged in a matrix form, row decoders 4, sense amplifiers 5a and 5b, a peripheral circuit 8, and a pad part 9.

The memory cell array 3 is formed by arranging a plurality of NAND cell units NU each of which is obtained by connecting memory cell transistors 2 in series. The sense amplifiers 5a and 5b are arranged in the direction of the bit line BL of the memory cell array 3. The row decoders 4 are arranged respectively at both ends of the memory cell array 3 in the direction of the word line WL.

Each of the memory cell transistors 2 has, for example, a floating gate formed over a semiconductor substrate via a tunnel insulation film and a control gate laminated over the floating gate via an inter-gate insulation film. The memory cell transistor 2 is adapted to be able to read data according to a value of a retained threshold voltage when a read voltage is applied to the control gate.

A first end of the NAND cell unit NU is connected to a bit line BL via a selection gate transistor S1. A second end of the NAND cell unit NU is connected to a common source line SL via a selection gate transistor S2. Control gates of memory cell transistors 2 on the same row are connected to a word line WL. Word lines WL and bit lines BL are arranged respectively in the row direction and the column direction so as to intersect each other.

Control gates of the selection gate transistors S1 and S2 are connected to selection gate lines SGL.

A control signal generation circuit, an internal voltage circuit and so on (not illustrated) are arranged in the peripheral circuit 8. Input and output terminals (not illustrated) of an address and an external control signal are arranged in the pad part 9.

The row decoders 4 are disposed on end sides of the word lines WL to conduct selective drive on the word lines WL and the selection gate lines SGL (to control voltages on the word lines WL and the selection gate lines SGL) in accordance with an address which is input via the pad part 9 and the peripheral circuit 8.

The sense amplifier 5a is disposed on a first end side of the bit line BL, and the sense amplifier 5b is disposed on a second end side of the bit line BL. Each of the sense amplifiers 5a and 5b includes a plurality of sense amplifier circuits to write and read data.

In the memory cell array 3, the word lines WL or the bit lines BL are typically formed with a fine pitch (the minimum line width and interval, i.e., the minimum line and space which depends on the lithography resolution technique).

Figure 2:
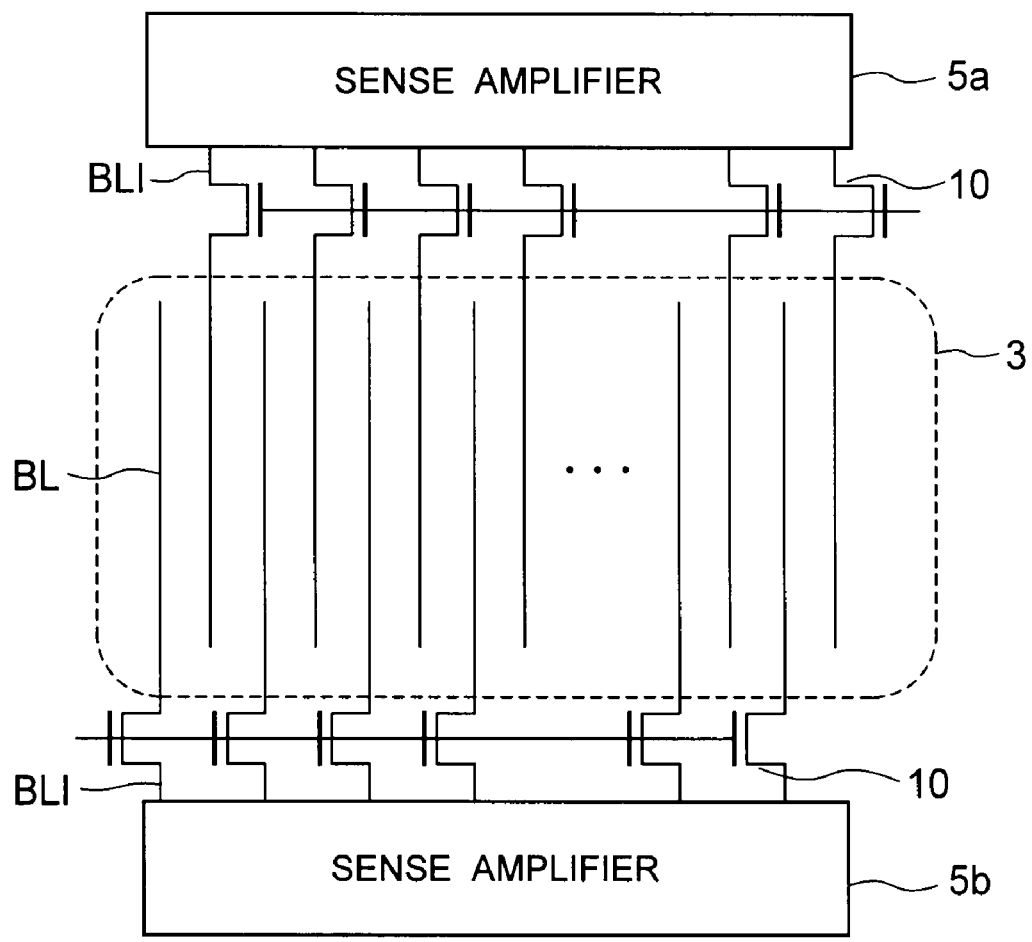
FIG. 2 is a diagram showing an example of connection relations among the bit lines BL in the memory cell array 3, and the sense amplifiers 5a and 5b shown in FIG. 1.

FIG. 2 is a diagram showing an example of connection relations among the bit lines BL in the memory cell array 3, and the sense amplifiers 5a and 5b shown in FIG. 1.

As shown in FIG. 2, interconnections BLI in the sense amplifiers 5a and 5b are connected to the bit lines BL via MOS transistors 10 which are set to have a high threshold voltage. Half of the bit lines BL are connected to the sense amplifier 5a, and remaining half of the bit lines BL are connected to the sense amplifier 5b.

Hereafter, an interconnection layout in the sense amplifier 5b in the NAND flash memory 100 according to the first embodiment will be described. By the way, arrangement relations between the sense amplifier 5a and the bit lines BL are similar.

Figure 3:
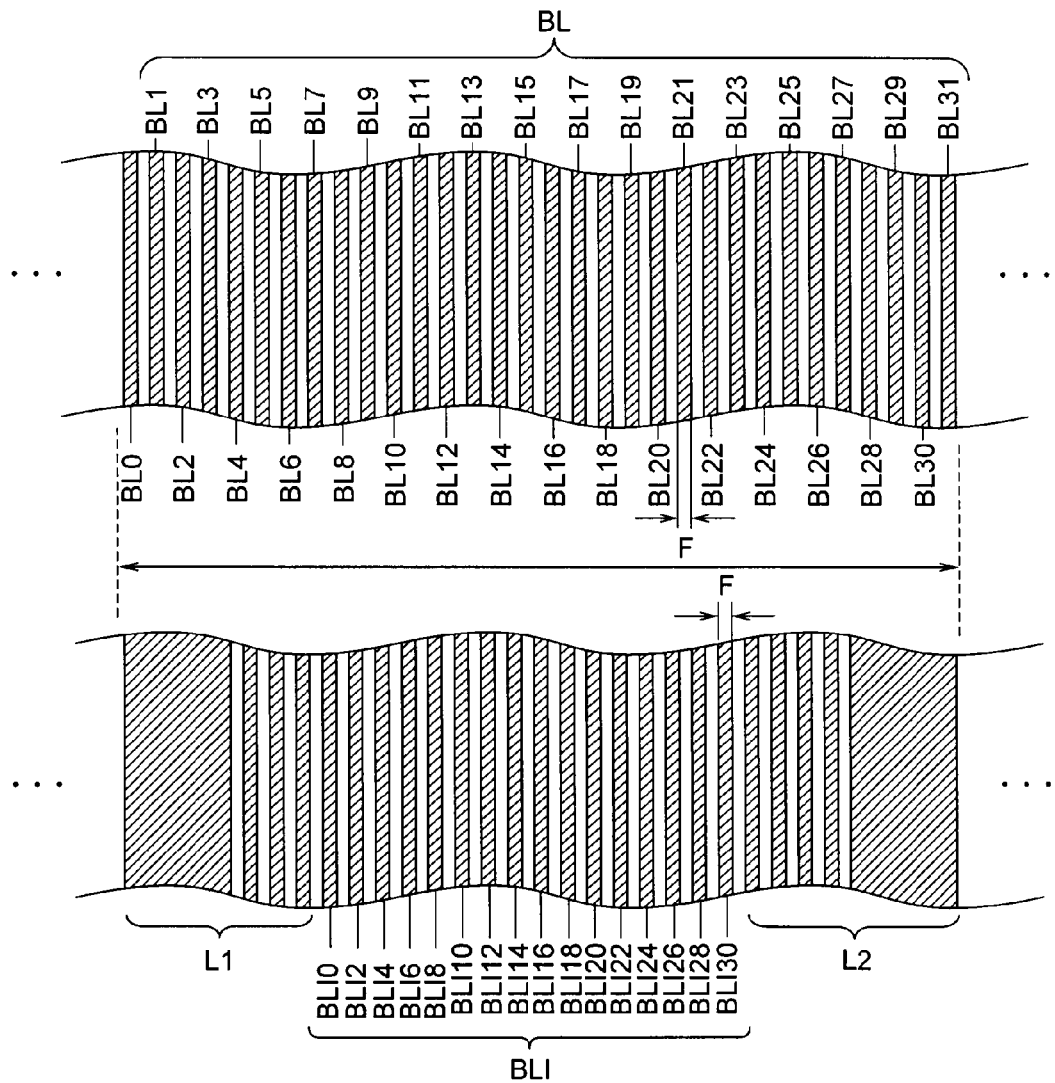
FIG. 3 is a top view showing an arrangement of interconnections including the bit lines BL and the interconnections BLI in the sense amplifier 5b shown in FIG. 2.

FIG. 3 is a top view showing an arrangement of interconnections including the bit lines BL and the interconnections BLI in the sense amplifier 5b shown in FIG. 2.

In FIG. 3, the bit lines BL0, BL2, . . . , BL30 are connected respectively to the interconnections BLI0, BLI2, . . . , BLI30 in the sense amplifier 5b in one-to-one correspondence. The bit lines BL1, BL3, . . . , BL31 are connected to the interconnections BLI in the sense amplifier 5a. L1 and L2 functioning as a power line and a control signal line are arranged on both sides of the interconnections BLI.

As shown in FIG. 3, a direction in which the bit lines BL (BL0 to BL31) extend is parallel to a direction in which the interconnections BLI (BLI0, BLI2, . . . , BLI30) in the sense amplifier 5b extend. Since the bit lines BL and the interconnections BLI are formed by using the side wall processing technique as already described, they are not bent or broken. The bit lines BL have a width F which is the same as that of the interconnections BLI.

Figure 4:
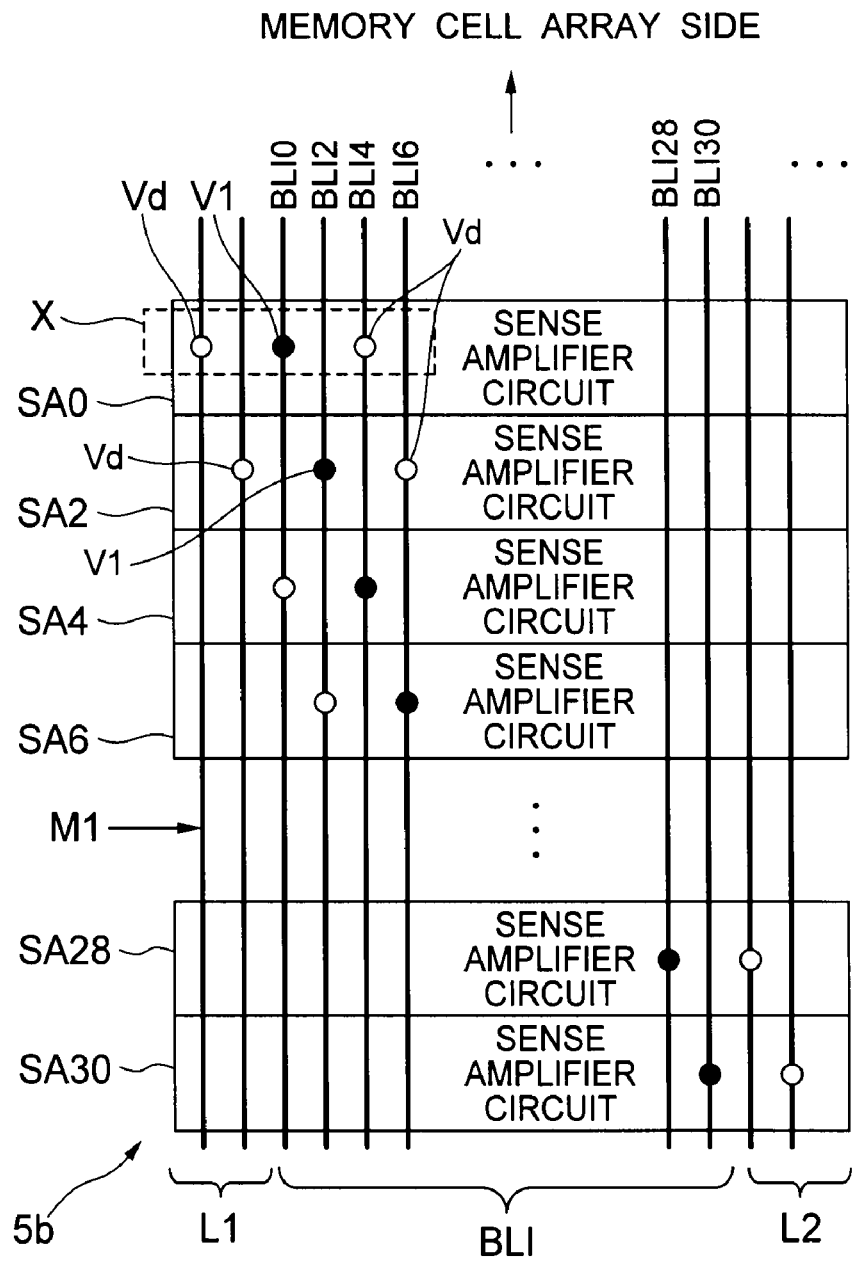
FIG. 4 is a schematic diagram schematically showing connection relations between the interconnections BLI in the sense amplifier 5b shown in FIG. 3 and the sense amplifier circuits in the sense amplifier 5b.

FIG. 4 is a schematic diagram schematically showing connection relations between the interconnections BLI in the sense amplifier 5b shown in FIG. 3 and the sense amplifier circuits in the sense amplifier 5b.

As shown in FIG. 4, sense amplifier circuits SA0, SA2, . . . , SA30 in the sense amplifier 5b are connected respectively to the interconnections BLI0, BLI2, . . . , BLI30 via contact interconnections V1 in one-to-one correspondence. A dummy contact interconnection Vd is disposed so as to be adjacent to each contact interconnection V1. For example, in the sense amplifier circuit SA0, the contact interconnection V1 connected to the interconnection BLI0 is adjacent to a dummy contact interconnection Vd connected to the BLI4.

As the pitch in the memory cell array 3 shrinks, the circuit arrangement in the sense amplifiers 5a and 5b also becomes narrow. Therefore, it becomes difficult to let interconnections pass generation after generation.

As already described, therefore, interconnections on the sense amplifier circuits in the sense amplifiers 5a and 5b are also formed by using the side wall processing technique in the same way as the bit lines. As a result, pitch shrinking is implemented. In this case, it becomes difficult to expose contact interconnections between interconnection layers in the sense amplifiers 5a and 5b to light, as already described above.

In the present first embodiment, therefore, not only Sraf's are disposed in the photomask (reticle), but also dummy contact interconnections are disposed so as to be adjacent to the contact interconnections V1 in the semiconductor storage device 100.

Hereafter, relations including the contact interconnections and the dummy contact interconnections will be described by taking the vicinity of an area X of the sense amplifier 5b as an example.

Figure 5:
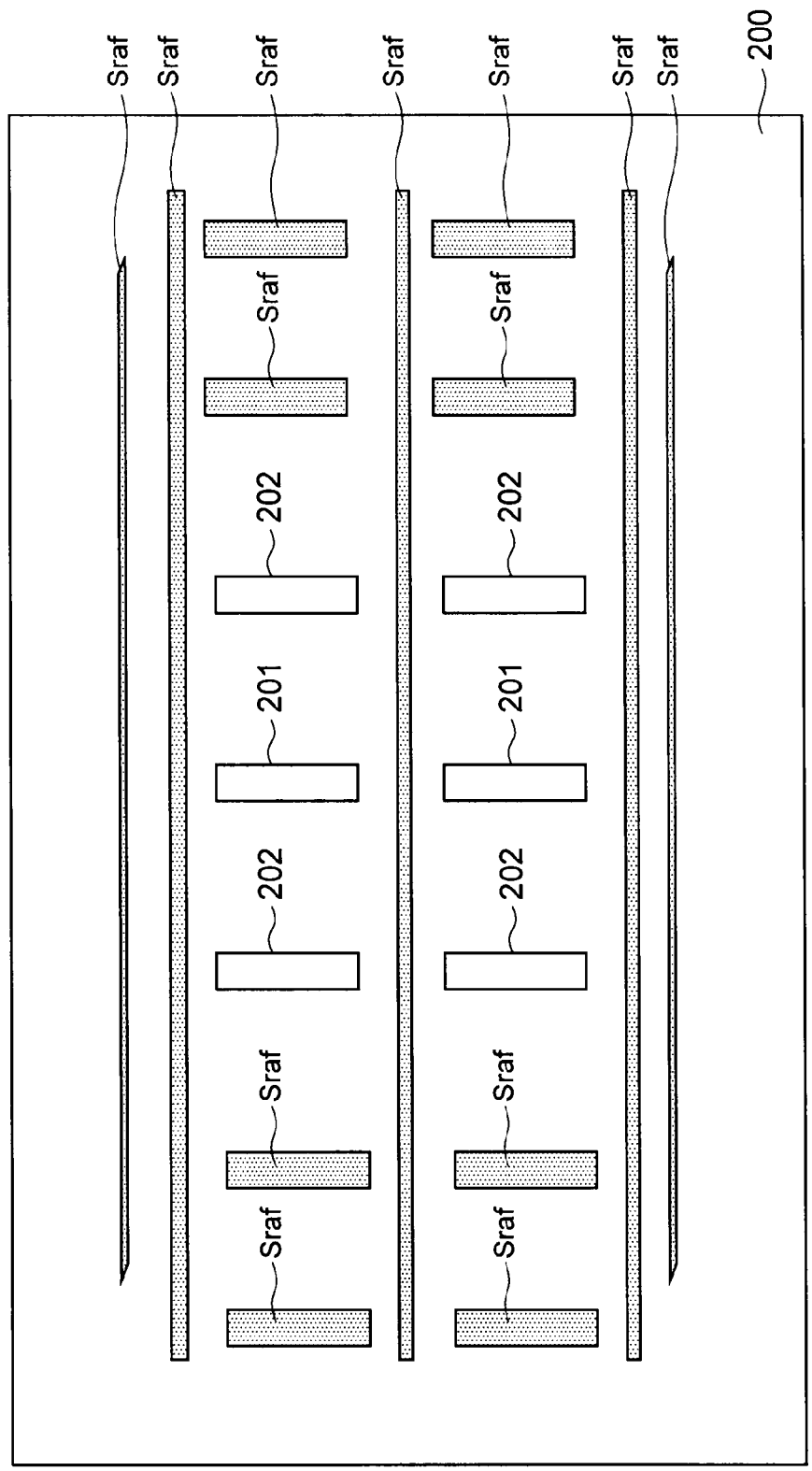
FIG. 5 is a top view showing an example of a configuration of a photomask (reticle) for forming holes of the contact interconnections in the sense amplifier.
Figure 6:
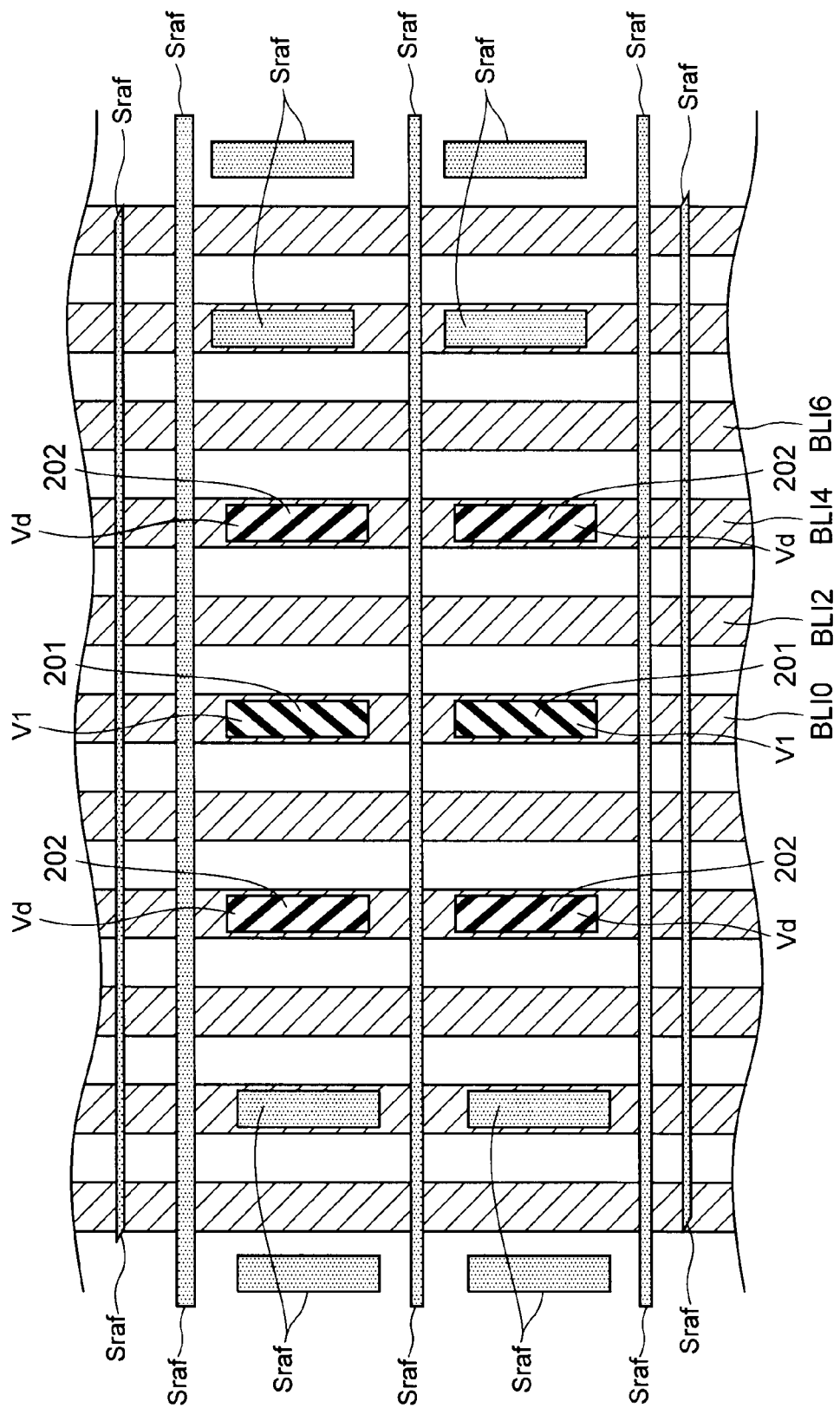
FIG. 6 is a diagram showing position relations between a pattern of the photomask (reticle) shown in FIG. 5 and an interconnection configuration near an area X in the sense amplifier 5b shown in FIG. 4.

FIG. 5 is a top view showing an example of a configuration of a photomask (reticle) for forming holes of the contact interconnections in the sense amplifier. FIG. 6 is a diagram showing position relations between a pattern of the photomask (reticle) shown in FIG. 5 and an interconnection configuration near an area X in the sense amplifier 5b shown in FIG. 4.

As shown in FIG. 5, in the reticle 200, opened dummy patterns 202 corresponding to dummy contact interconnections Vd are disposed on both sides of opening patterns 201 corresponding to contact interconnections V1. In addition, in the reticle 201, Sraf's are arranged beginning with positions adjacent to the dummy patterns 202, and Sraf's are arranged above and below the opening patterns 201 as well.

As shown in FIG. 6, it becomes possible to transfer opening patterns 201 corresponding to the contact interconnections V1 formed in the reticle 200 to the resist more certainly. In this case, the dummy patterns 202 are also transferred to the resist. The contact interconnections V1 and the dummy contact interconnections Vd are patterned by using this resist.

In this case, the dummy patterns 202 corresponding to the dummy contact interconnections Vd are harder to transfer to the resist than the opening patterns 201 corresponding to the contact interconnections V1. However, since the dummy contact interconnections Vd are not used, there is no problem in this matter.

An example of a configuration including interconnections located above and below the interconnections BLI in the interconnection configuration in the vicinity of the area X in the sense amplifier 5b will now be described.

Figure 7:
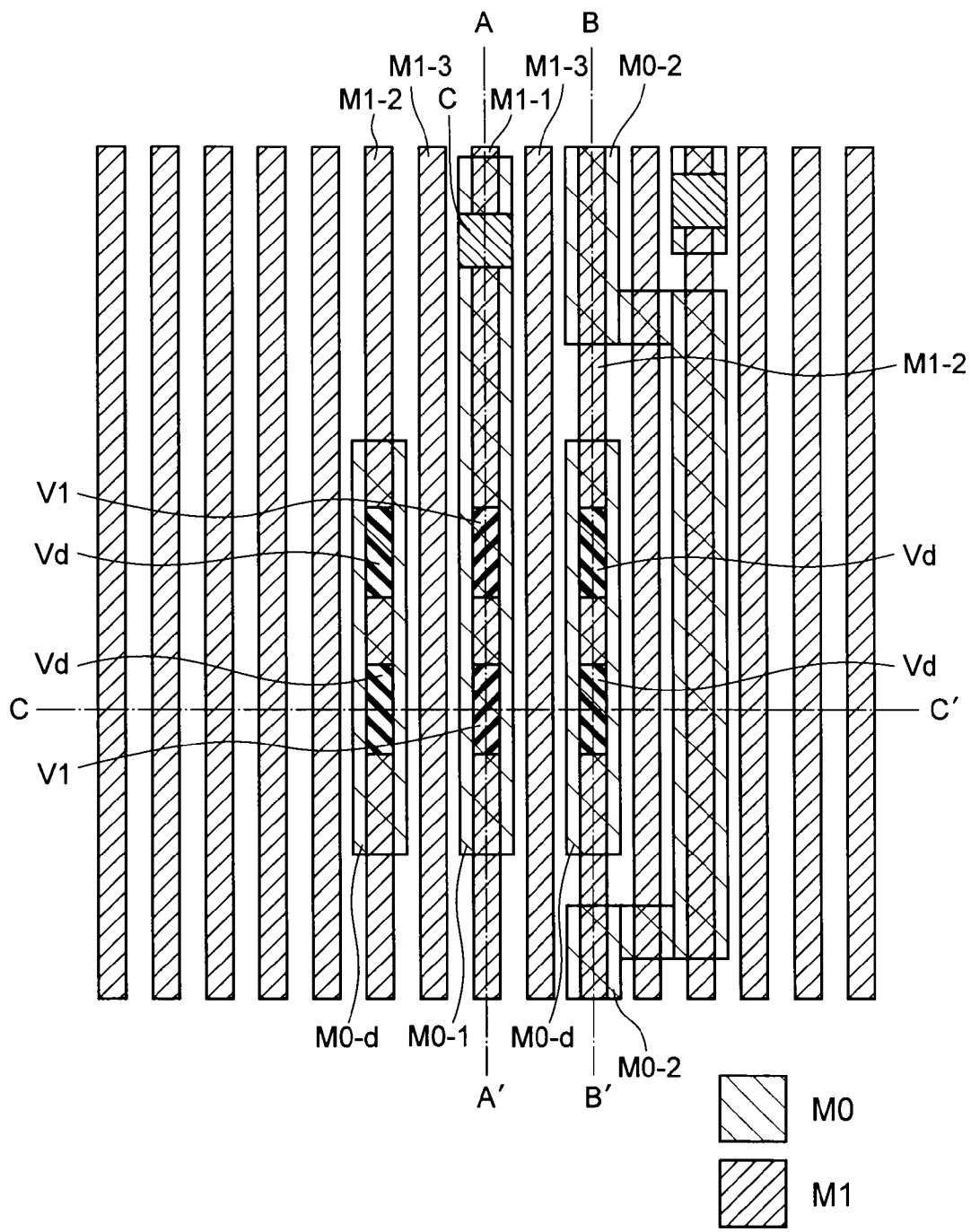
FIG. 7 is a diagram showing an example of the interconnection configuration in the vicinity of the area X in the sense amplifier 5b shown in FIG. 4.

FIG. 7 is a diagram showing an example of the interconnection configuration in the vicinity of the area X in the sense amplifier 5b shown in FIG. 4. In FIG. 7, a first upper interconnection M1-1 corresponds to the interconnection BLI0 in FIG. 4, a second upper interconnection M1-2 on the right side corresponds to the interconnection BLI4 in FIG. 4, and a third upper interconnection M1-3 on the right side corresponds to the interconnection BLI2 in FIG. 4.

Figure 8A:
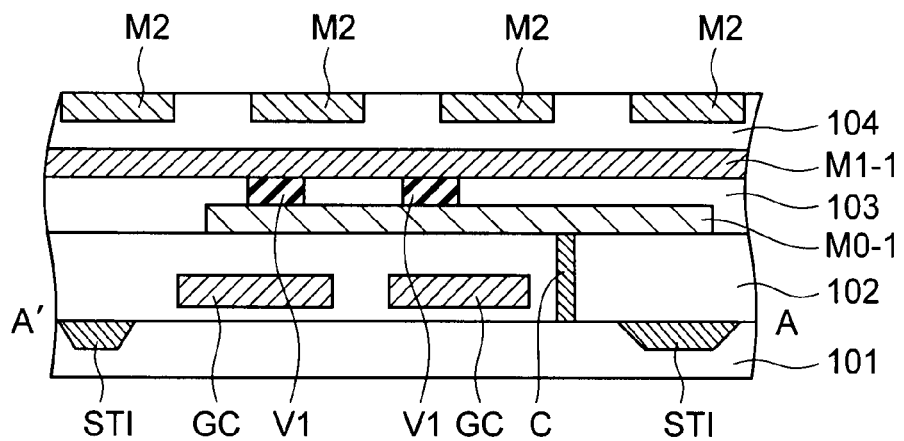
FIG. 8A is a sectional view showing a section obtained along A-A' in FIG. 7.
Figure 8B:
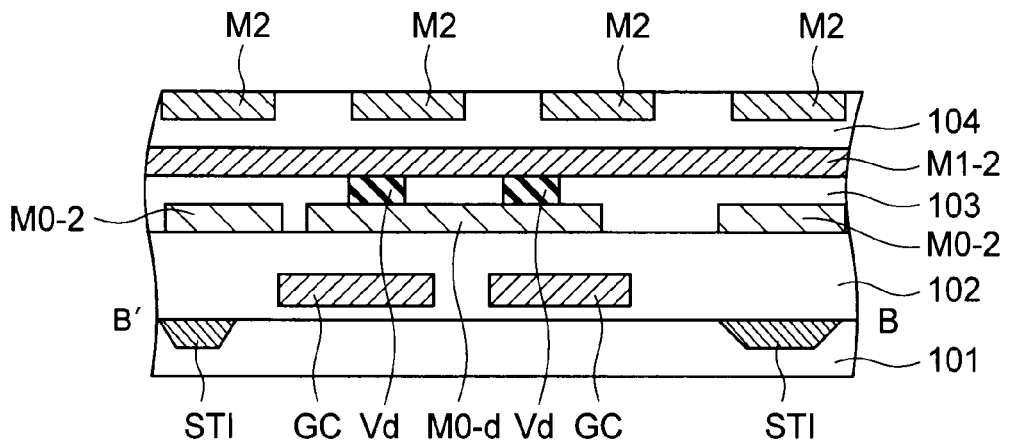
FIG. 8B is a sectional view showing a section obtained along B-B' in FIG. 7.
Figure 8C:
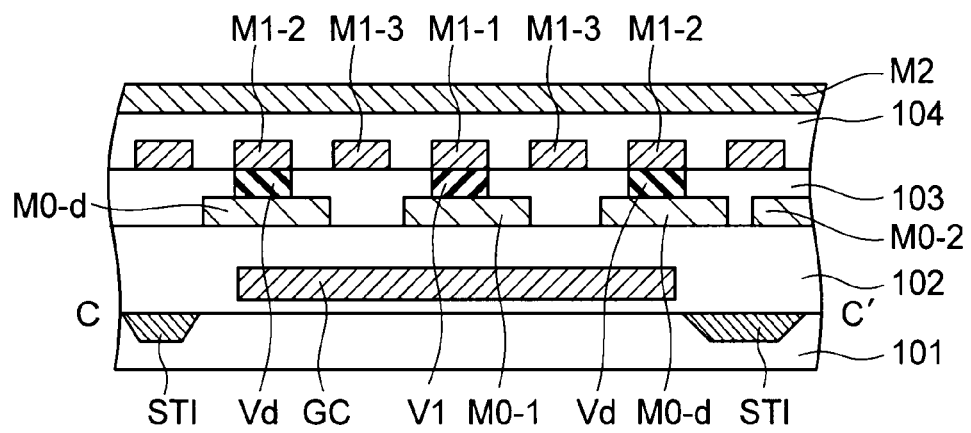
FIG. 8C is a sectional view showing a section obtained along C-C' in FIG. 7.

FIG. 8A is a sectional view showing a section obtained along A-A' in FIG. 7. FIG. 8B is a sectional view showing a section obtained along B-B' in FIG. 7. FIG. 8C is a sectional view showing a section obtained along C-C' in FIG. 7. A semiconductor substrate 101, an element isolation region STI, first to third interlayer insulation films 102, 103 and 104, a first lower interconnection M0-1, a dummy lower interconnection M0-d, and interconnections GC and M2 shown in FIGS. 8A to 8C are omitted in FIG. 7.

As shown in FIGS. 7 and 8A to 8C, the sense amplifier 5b includes the semiconductor substrate 101, the first to third interlayer insulation films 102, 103 and 104, the first lower interconnection M0-1, a second lower interconnection M0-2, the dummy lower interconnection M0-d, the first upper wiring interconnection M1-1, the second upper interconnection M1-2, the third upper interconnection M1-3, the contact interconnection V1, and the dummy contact interconnection Vd.

The first lower interconnection M0-1 is formed so as to extend in a first direction (the direction of the bit line BL) on the first interlayer insulation film 102 which is formed on the semiconductor substrate 101. The interconnections GC are formed in the first interlayer insulation layer 102. The interconnections GC contain, for example, nickel silicon as a principal ingredient.

The dummy lower interconnection M0-d is formed so as to extend in the first direction (the direction of the bit line BL) on the first interlayer insulation film 102.

The second interlayer insulation film 103 is formed on the first interlayer insulation film 102 including top of the first lower interconnection M0-1.

The contact interconnections V1 are formed in a direction perpendicular to the substrate plane of the semiconductor substrate 101 so as to pass through the second interlayer insulation film 103 and connected to the first lower interconnection M0-1.

The first upper interconnection M1-1 is formed on the second interlayer insulation film 103, and connected to the contact interconnections V1 disposed thereunder.

The second upper interconnection M1-2 is formed on the second interlayer insulation film 103 so as to extend in the first direction (the direction of the bit line BL) and so as to be adjacent to the first upper interconnection M1-1 (via the third upper interconnection M1-3). In other words, the second upper interconnections M1-2 are disposed on both sides of the first upper interconnection M1-1 via the third upper interconnections M1-3 formed on the second interlayer insulation film 103. The second upper interconnections M1-2 are connected to the dummy contact interconnections Vd disposed thereunder.

The dummy contact interconnections Vd are formed in the direction perpendicular to the substrate plane of the semiconductor substrate 101 so as to pass through the second interlayer insulation film 103. The dummy contact interconnections Vd are adjacent to the contact interconnections V1 via the second interlayer insulation film 103 and are connected to the dummy interconnections M0-$d$.

The dummy lower interconnections M0-$d$ are electrically connected only to the second upper interconnections M1-2 via the dummy contact interconnections Vd. With this structure, it is possible to suppress inputting of unwanted signals to the second upper interconnections M1-2 via the dummy lower interconnections M0-$d$.

The first and second lower interconnections M0-1 and M0-2 and the dummy lower interconnections M0-$d$ are made wider in line width than the first to third upper interconnections M1-1 to M1-3. The first lower interconnection M0-1 and the dummy lower interconnections M0-$d$ contain, for example, tungsten as the principal ingredient.

The first and second lower interconnections M0-1 and M0-2 and the dummy lower interconnections M0-$d$ are not formed by using the side wall processing technique. Therefore, the first and second lower interconnections M0-1 and M0-2 and the dummy lower interconnections M0-$d$ can be bent and broken. The second lower interconnections M0-2 are formed so as to detour around the dummy lower interconnections M0-$d$.

As already described, the first to third upper interconnections M1-1 to M1-3 functioning as the interconnections BLI are connected to the bit lines BL via the MOS transistors 10. The first to third upper interconnections M1-1 to M1-3 contain, for example, copper as the principal ingredient. Since the first to third upper interconnections M1-1 to M1-3 are formed by using the side wall processing technique, the first to third upper interconnections M1-1 to M1-3 have equal line widths.

Such a configuration of the sense amplifier 5$b$ in the semiconductor storage device 100 is a configuration needed to transfer the opening patterns 201 corresponding to the contact interconnections V1 formed in the reticle 200 to the resist more certainly. In other words, according to the semiconductor storage device 100, the lithography margin can be widened for contact interconnections having a large number of pattern variations and a strict lithography margin without using the double exposure technique and the double processing technique.

In the example shown in FIGS. 7 and 8A to 8C, the dummy lower interconnections M0-$d$ are disposed under the dummy contact interconnections Vd. As shown in FIGS. 9, 10A to 10C, however, the dummy lower interconnections M0-$d$ need not necessarily be disposed under the dummy contact interconnections Vd. Because the interlayer insulation film 102 is provided between the first and second lower interconnections M0-1 and M0-2 and the dummy lower interconnections M0-$d$ and the interconnections GC, and consequently the contact holes do not arrive at the interconnections GC due to overetching.

Figure 9:
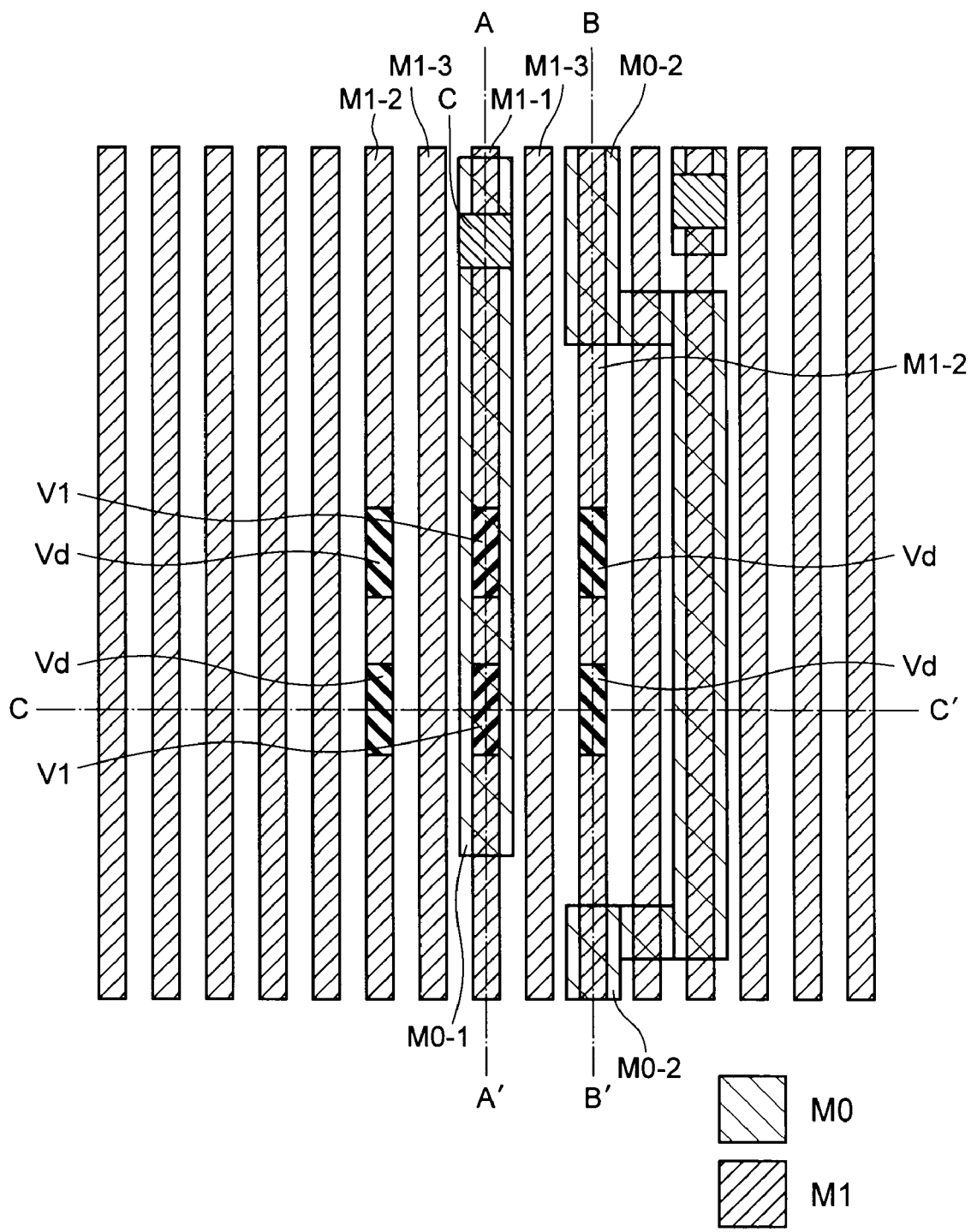
FIG. 9 is a diagram showing another example of the interconnection configuration in the vicinity of the area X in the sense amplifier 5b shown in FIG. 4.

FIG. 9 is a diagram showing another example of the interconnection configuration in the vicinity of the area X in the sense amplifier 5$b$ shown in FIG. 4. In FIG. 9, a first upper interconnection M1-1 corresponds to the interconnection BLI0 in FIG. 4, a second upper interconnection M1-2 on the right side corresponds to the interconnection BLI4 in FIG. 4, and a third upper interconnection M1-3 on the right side corresponds to the interconnection BLI2 in FIG. 4.

Figure 10A:
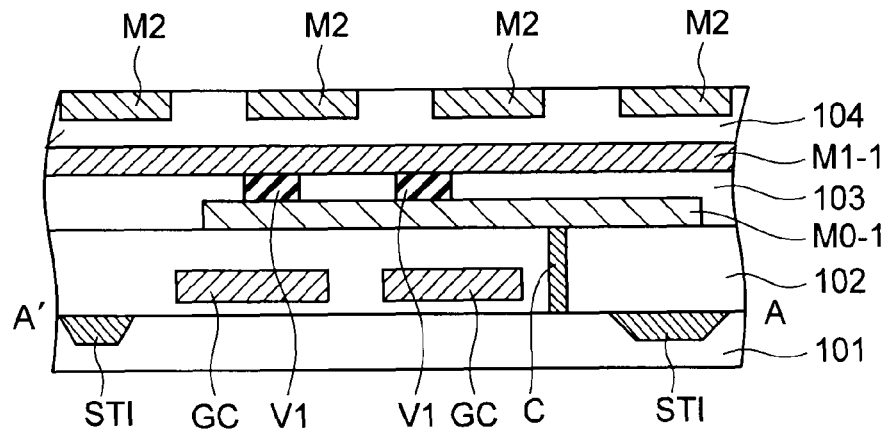
FIG. 10A is a sectional view showing a section taken from line A-A' in FIG. 9.
Figure 10B:
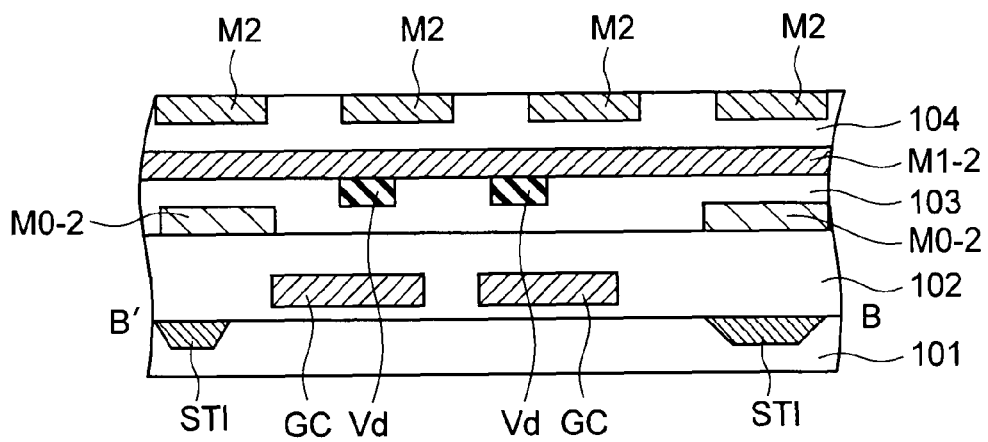
FIG. 10B is a sectional view showing a section taken from line B-B' in FIG. 9.
Figure 10C:
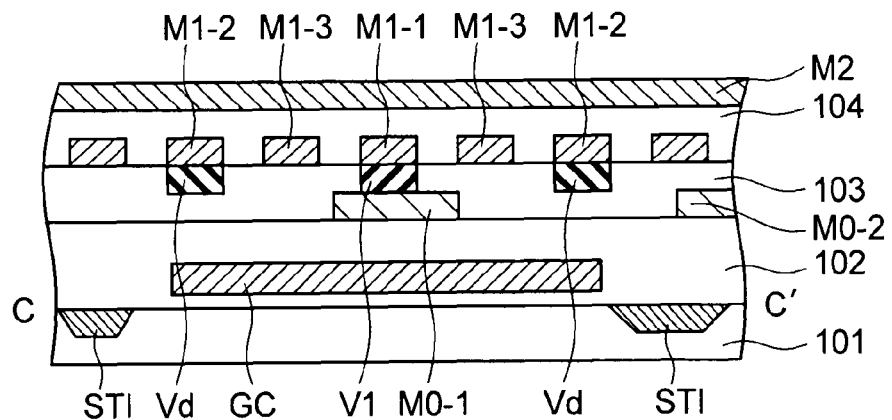
FIG. 10C is a sectional view showing a section taken from line C-C' in FIG. 9.

FIG. 10A is a sectional view showing a section taken from line A-A' in FIG. 9. FIG. 10B is a sectional view showing a section taken from line B-B' in FIG. 9. FIG. 10C is a sectional view showing a section taken from line C-C' in FIG. 9. A semiconductor substrate 101, an element isolation region STI, first to third interlayer insulation films 102, 103 and 104, a first lower interconnection M0-1, and interconnections GC and M2 shown in FIGS. 10A to 10C are omitted in FIG. 9. In FIGS. 9 and 10A to 10C, the reference numerals and characters as those in FIGS. 7 and 8A to 8C denote the same components.

As shown in FIGS. 9 and 10A to 10C, the sense amplifier 5$b$ includes the semiconductor substrate 101, the first to third interlayer insulation films 102, 103 and 104, the first lower interconnection M0-1, the second lower interconnection M0-2, the first upper wiring interconnection M1-1, the second upper interconnection M1-2, the third upper interconnection M1-3, the contact interconnection V1, and the dummy contact interconnection Vd. Here, the dummy lower interconnections are not disposed under the dummy contact interconnections Vd in the sense amplifier 5$b$.

The dummy contact interconnections Vd are formed in the second interlayer insulation film 103 in the direction perpendicular to the substrate plane of the semiconductor substrate 101, and are adjacent to the contact interconnections V1 via the second interlayer insulation film 103. The dummy contact interconnections Vd are electrically connected only to the second upper interconnections M1-2.

Such a configuration of the sense amplifier 5$b$ in the semiconductor storage device 100 is a configuration needed to transfer the opening patterns 201 corresponding to the contact interconnections V1 formed in the reticle 200 to the resist more certainly. In other words, according to the semiconductor storage device 100, the lithography margin can be widened for contact interconnections having a large number of pattern variations and a strict lithography margin without using the double exposure technique and the double processing technique, unlike the prior art.

According to the semiconductor storage device in the present embodiment, the lithography margin can be widened.

What is claimed is:

1. A semiconductor storage device comprising:
    a memory cell array including memory cell transistor from which data depending upon a value of a retained threshold voltage can be read out by applying a readout voltage to a control gate thereof;
    a row decoder which controls voltage on a word line connected to the control gate of the memory cell transistor; and
    a sense amplifier connected to a bit line which is connected to the memory cell transistor,
    wherein the sense amplifier includes:
    a first lower interconnection formed so as to extend in a first direction on a first interlayer insulation film formed on a semiconductor substrate;
    a second interlayer insulation film formed on the first interlayer insulation film and top of the first interconnection;
    a contact interconnection formed in a direction perpendicular to a substrate plane of the semiconductor substrate so as to pass through the second interlayer insulation film, and connected to the first lower interconnection;

a first upper interconnection formed on the second interlayer insulation film and connected to the contact interconnection disposed under the first upper interconnection;

a dummy contact interconnection formed in a direction perpendicular to the substrate plane of the semiconductor substrate in the second interlayer insulation film, and adjacent to the contact interconnection; and a second upper interconnection formed on the second interlayer insulation film so as to extend in the first direction, and connected to the dummy contact interconnection disposed under the second upper interconnection, and wherein a dummy lower interconnection is electrically connected only to the second upper interconnection.

2. The semiconductor storage device according to claim 1, wherein the second upper interconnection is arranged on both sides of the first upper interconnection.

3. The semiconductor storage device according to claim 1, wherein the first lower interconnection is made wider in line width than the first upper interconnection and the second upper interconnection.

4. The semiconductor storage device according to claim 1, wherein the first upper interconnection is connected to the bit line.

5. The semiconductor storage device according to claim 1, wherein the semiconductor storage device is a non-volatile semiconductor storage device.

6. The semiconductor storage device according to claim 1, wherein the semiconductor storage device is a NAND flash memory.

7. The semiconductor storage device according to claim 1, wherein the first lower interconnection contains tungsten as a principal ingredient, and the first upper interconnection and the second upper interconnection contain copper as a principal ingredient.

8. The semiconductor storage device according to claim 1, further comprising a MOS transistor connected between the bit line and the first upper interconnection.

9. The semiconductor storage device according to claim 1, wherein the first upper interconnection and the second upper interconnection have equal line widths.

10. The semiconductor storage device according to claim 1, wherein a third upper interconnection is formed on the second interlayer insulation film between the first upper interconnection and the second upper interconnection.

11. A semiconductor storage device comprising:

a memory cell array including memory cell transistor from which data depending upon a value of a retained threshold voltage can be read out by applying a readout voltage to a control gate thereof;

a row decoder which controls voltage on a word line connected to the control gate of the memory cell transistor; and a sense amplifier connected to a bit line which is connected to the memory cell transistor, wherein the sense amplifier includes:

a first lower interconnection formed so as to extend in a first direction on a first interlayer insulation film formed on a semiconductor substrate;

a second interlayer insulation film formed on the first interlayer insulation film and top of the first interconnection;

a contact interconnection formed in a direction perpendicular to a substrate plane of the semiconductor substrate so as to pass through the second interlayer insulation film, and connected to the first lower interconnection;

a first upper interconnection formed on the second interlayer insulation film and connected to the contact interconnection disposed under the first upper interconnection;

a dummy lower interconnection formed so as to extend in the first direction on the first interlayer insulation film;

a dummy contact interconnection formed in a direction perpendicular to the substrate plane of the semiconductor substrate so as to pass through the second interlayer insulation film, adjacent to the contact interconnection, and connected to the dummy lower interconnection; and a second upper interconnection formed on the second interlayer insulation film so as to extend in the first direction, and connected to the dummy contact interconnection disposed under the second upper interconnection, and wherein the dummy lower interconnection is electrically connected only to the second upper interconnection via the dummy contact interconnection.

12. The semiconductor storage device according to claim 11, wherein the second upper interconnection is arranged on both sides of the first upper interconnection.

13. The semiconductor storage device according to claim 11, wherein the first lower interconnection is made wider in line width than the first upper interconnection and the second upper interconnection.

14. The semiconductor storage device according to claim 11, wherein the first upper interconnection is connected to the bit line.

15. The semiconductor storage device according to claim 11, wherein the semiconductor storage device is a non-volatile semiconductor storage device.

16. The semiconductor storage device according to claim 11, wherein the semiconductor storage device is a NAND flash memory.

17. The semiconductor storage device according to claim 11, wherein the first lower interconnection contains tungsten as a principal ingredient, and the first upper interconnection and the second upper interconnection contain copper as a principal ingredient.

18. The semiconductor storage device according to claim 11, further comprising a MOS transistor connected between the bit line and the first upper interconnection.

19. The semiconductor storage device according to claim 11, wherein the first upper interconnection and the second upper interconnection have equal line widths.

20. The semiconductor storage device according to claim 11, wherein a third upper interconnection is formed on the second interlayer insulation film between the first upper interconnection and the second upper interconnection.

* * * * *